United States Patent [19]
Yamamoto et al.

[11] Patent Number: 5,505,809
[45] Date of Patent: Apr. 9, 1996

[54] METHOD OF PREPARING A PLURALITY OF CERAMIC GREEN SHEETS HAVING CONDUCTOR FILMS THEREON

[75] Inventors: Shinya Yamamoto; Hirokazu Higuchi; Mitsuro Hamuro; Toshihiko Kogame, all of Kyoto, Japan

[73] Assignee: Murata Manufacturing Co., Ltd., Japan

[21] Appl. No.: 140,330

[22] Filed: Oct. 20, 1993

Related U.S. Application Data

[63] Continuation of Ser. No. 723,410, Jul. 1, 1991, abandoned.

[30] Foreign Application Priority Data

Jul. 19, 1990 [JP] Japan ................... 2-192134

[51] Int. Cl.⁶ .................................. B32B 31/00
[52] U.S. Cl. .................. 156/264; 156/89; 156/261; 29/25.42; 361/321.2; 264/58; 264/61; 264/153
[58] Field of Search ................ 156/89, 261, 264; 361/321; 29/25.42; 264/58, 61, 153

[56] References Cited

U.S. PATENT DOCUMENTS

| | | | |
|---|---|---|---|
| 2,389,420 | 10/1943 | Deyrup | 264/67 |
| 2,969,300 | 1/1961 | Franz | 156/245 |
| 3,284,683 | 11/1966 | Rieth | 156/89 |
| 3,287,195 | 11/1966 | Piazze | 156/261 |
| 3,518,756 | 7/1970 | Bennett et al. | 264/58 |
| 3,535,780 | 10/1967 | Berger | 29/626 |
| 3,617,834 | 11/1971 | Rayburn | 361/271 |
| 3,648,132 | 3/1972 | Rayburn | 361/321 |
| 3,652,363 | 3/1972 | Kinslow, Jr. | 226/113 |
| 3,724,068 | 4/1973 | Galli | 228/1 |
| 3,819,439 | 6/1974 | Taylor | 156/89 |
| 3,933,563 | 1/1976 | Carlisle | 156/261 |
| 4,010,885 | 3/1977 | Keizer et al. | 228/4 |
| 4,316,320 | 2/1982 | Nogawa et al. | 29/835 |
| 4,347,650 | 9/1982 | McLarney et al. | 29/25.42 |
| 4,419,713 | 12/1983 | Levinson | 361/330 |
| 4,470,098 | 9/1984 | Alexander | 29/25.42 |
| 4,513,350 | 4/1985 | Coleman | 29/25.42 |
| 4,786,342 | 11/1988 | Zellner et al. | 156/89 |
| 4,990,080 | 2/1991 | Kakimoto | 156/89 |
| 4,991,055 | 2/1991 | Marneffe et al. | 29/25.42 |
| 5,019,200 | 3/1991 | Kawabata et al. | 156/245 |
| 5,051,219 | 9/1991 | Miller | 264/40.7 |
| 5,051,862 | 9/1991 | Pageaud et al. | 29/25.42 |
| 5,174,842 | 12/1992 | Hamuro et al. | 156/89 |
| 5,224,250 | 7/1993 | Hamuro et al. | 29/25.42 |
| 5,261,986 | 11/1993 | Kawabata et al. | 156/277 |

FOREIGN PATENT DOCUMENTS 58-070886 7/1983 Japan.

*Primary Examiner*—David L. Lacey
*Assistant Examiner*—Sean Vincent
*Attorney, Agent, or Firm*—Ostrolenk, Faber, Gerb & Soffen

[57] ABSTRACT

In order to manufacture a multilayer ceramic electronic component such as a multilayer ceramic capacitor, a long ceramic green sheet is prepared, and this long ceramic green sheet is fed along its longitudinal direction and is successively subjected to steps of printing conductor films on the surface of the long ceramic green sheet with conductive paste, drying the conductor films, punching out the long ceramic green sheet into ceramic green sheets of prescribed sizes at prescribed punching positions with respect to the location of the conductor films, and stacking the punched ceramic green sheets with each other. The long ceramic green sheet is punched out under two types of different registering conditions with respect to the conductor films in the punching step, and ceramic green sheets obtained under the two different types of registering conditions are stacked with each other in the stacking step, so that conductor films having the same geometry can define internal electrodes for a multilayer ceramic capacitor. Capacitance provided by the multilayer ceramic capacitor can be changed by changing the registering conditions with respect to the locations of the conductor films in the punching step.

15 Claims, 4 Drawing Sheets

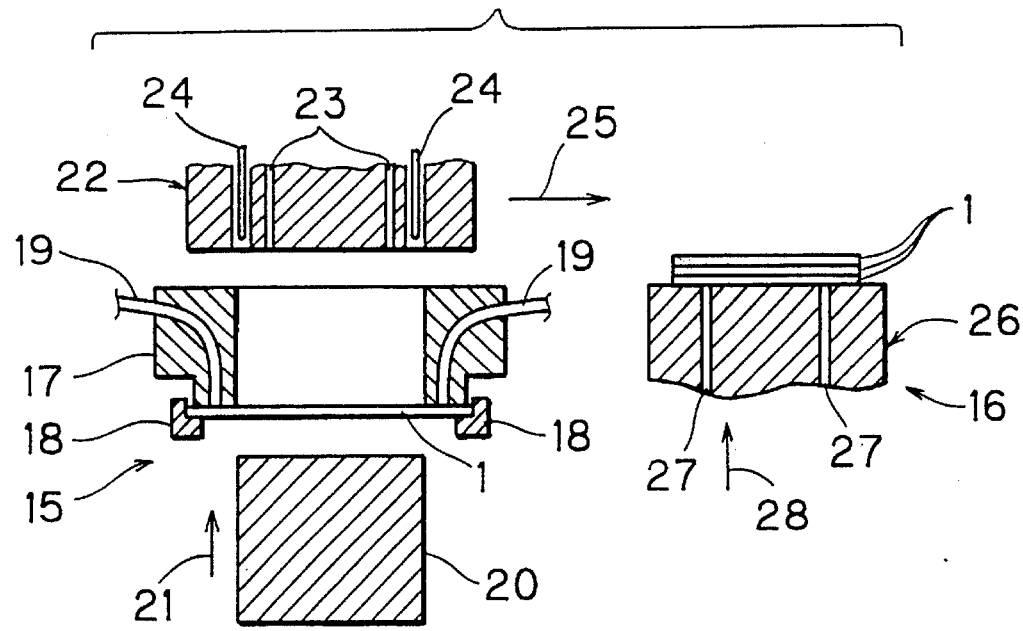
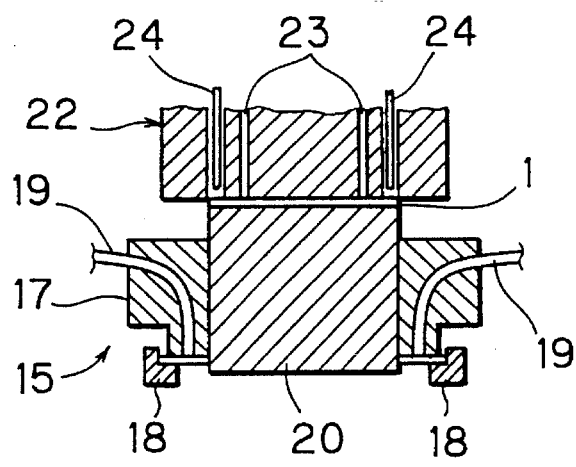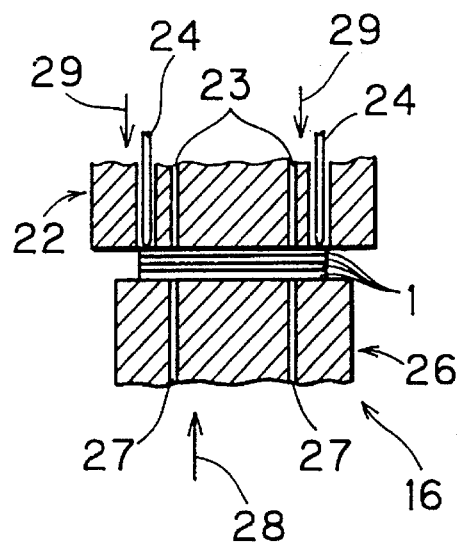

METHOD OF PREPARING A PLURALITY OF CERAMIC GREEN SHEETS HAVING CONDUCTOR FILMS THEREON

This is a File Wrapper continuation of application Ser. No. 07/723,410, filed on Jul. 1, 1991 now abandoned.

BACKGROUND OF THE INVENTION

1. Field of the Invention

The present invention relates to a method of manufacturing a multilayer ceramic electronic component such as a multilayer ceramic capacitor.

2. Description of the Background Art

Multilayer ceramic electronic components which are obtained by stacking ceramic green sheets with each other include a multilayer ceramic capacitor, a multilayer inductor, a multilayer circuit board and the like, for example. A multilayer ceramic capacitor, which is the most typical example of such multilayer ceramic electronic components, has generally been manufactured in the following manner:

(1) Rectangular ceramic green sheets to be stacked with each other are punched out from a large ceramic green sheet.
(2) Internal electrodes are printed on the rectangular ceramic green sheets with conductive paste.
(3) The printed internal electrodes are dried.
(4) Some of the ceramic green sheets which are provided with internal electrodes having a first pattern are alternately stacked with others provided with internal electrodes having a second pattern, which is different from the first pattern.
(5) The stacked ceramic green sheets are aligned with each other on the basis of their outlines thereof.
(6) The layered product of the ceramic green sheets is pressurized.
(7) The layered product is cut to obtain chips for defining individual multilayer ceramic capacitors, and thereafter each chip is subjected to a firing step and a step of forming external electrodes, to obtain a desired multilayer ceramic capacitor.

In the aforementioned method of manufacturing a multilayer ceramic capacitor, the rectangular ceramic green sheets having prescribed sizes are first obtained in step (1), and thereafter subjected to the steps (2) to (7). Particularly in the steps (2) to (5), the rectangular ceramic green sheets are directly handled. However, such direct handling of the ceramic green sheets becomes increasingly difficult as the ceramic green sheets are reduced in thickness.

The capacitance acquired by the multilayer ceramic capacitor is substantially determined in step (2). Namely, the internal electrodes are printed in step (2) on the ceramic green sheets, which have already been rectangularly punched out with determined outlines, and the stacked ceramic green sheets are aligned with each other in step (5) on their basis of the outlines. Thus, it is not possible to arbitrarily change the capacitance acquired by a multilayer ceramic capacitor formed in this way, insofar as the ceramic green sheets are provided with internal electrodes having the same types of patterns. In order to obtain a plurality of types of multilayer ceramic capacitors having different capacitance values, it is necessary to prepare a plurality of types of ceramic green sheets which are provided with internal electrodes having different patterns in step (2).

In step (4), further, the ceramic green sheets provided with the internal electrodes having the first pattern are alternately stacked with those provided with the internal electrodes having the second pattern. Thus, it is necessary to prepare at least two types of ceramic green sheets which are provided with internal electrodes.

SUMMARY OF THE INVENTION

Accordingly, an object of the present invention is to provide a method of manufacturing a multilayer ceramic electronic component, which can solve the aforementioned problems.

In order to solve the aforementioned problems, the present invention is adapted to first carry out the steps of printing conductor films on a long ceramic green sheet and drying the same, and thereafter to carry out the punching and stacking steps.

The present invention comprises the steps of preparing a long ceramic green sheet, printing conductor films on the surface of the long ceramic green sheet with conductive paste, drying the conductor films printed on the long ceramic green sheet, punching out the long ceramic green sheet into ceramic green sheets of prescribed sizes in a state registered with the conductor films, and stacking the punched ceramic green sheets with each other.

According to the present invention, the conductor films are printed on the ceramic green sheet which is still uncut, and then dried. Thereafter ceramic green sheets to be stacked with each other are punched out from the long ceramic green sheet, which is registered with the conductor films. Between the printing and punching steps, therefore, handling of the ceramic green sheet is simplified as compared with the conventional case of printing conductor films on already punched rectangular ceramic green sheets and drying the same. Thus, this solution readily copes with the problem of handling a ceramic green sheet which is reduced in thickness. Therefore, when the present invention is applied to a multilayer ceramic capacitor, for example, it is possible to obtain a multilayer ceramic capacitor having large capacitance.

According to the present invention, further, it is possible to obtain two sets of ceramic green sheets some that are provided with internal electrodes having a first pattern and others that are provided with internal electrodes having a second pattern, to be alternately stacked with each other in order to obtain a multilayer ceramic capacitor. This is accomplished, by forming all the internal electrodes in the same pattern, but displacing their respective punching positions. It is also possible to punch out ceramic green sheets which are provided with no conductor films such as internal electrodes.

According to the present invention, it is possible to obtain a plurality of types of multilayer ceramic capacitors in which the opposed internal electrodes have different areas, i.e., different acquired capacitance values, by controlling the positions where the long ceramic green sheet is punched out.

The foregoing and other objects, features, aspects and advantages of the present invention will become more apparent from the following detailed description of an embodiment of the present invention when taken in conjunction with the accompanying drawings.

BRIEF DESCRIPTION OF THE DRAWINGS

FIG. 2 is a sectional view showing a punching device 15 and a stacking device 16 which are arranged in a punching station 14 shown in FIG. 1;

FIG. 3 is a sectional view showing the punching device 15 and a transfer head 22 shown in FIG. 2, with a punched ceramic green sheet 1 which is carried onto the transfer head 22 after operation of a punch 20;

FIG. 4 is a sectional view showing the transfer head 22 and the stacking device 16 shown in FIG. 2, with ceramic green sheets 1 which are carried by the transfer head 22 and stacked on a stacking base 26;

DESCRIPTION OF THE PREFERRED EMBODIMENT

Figure 1:
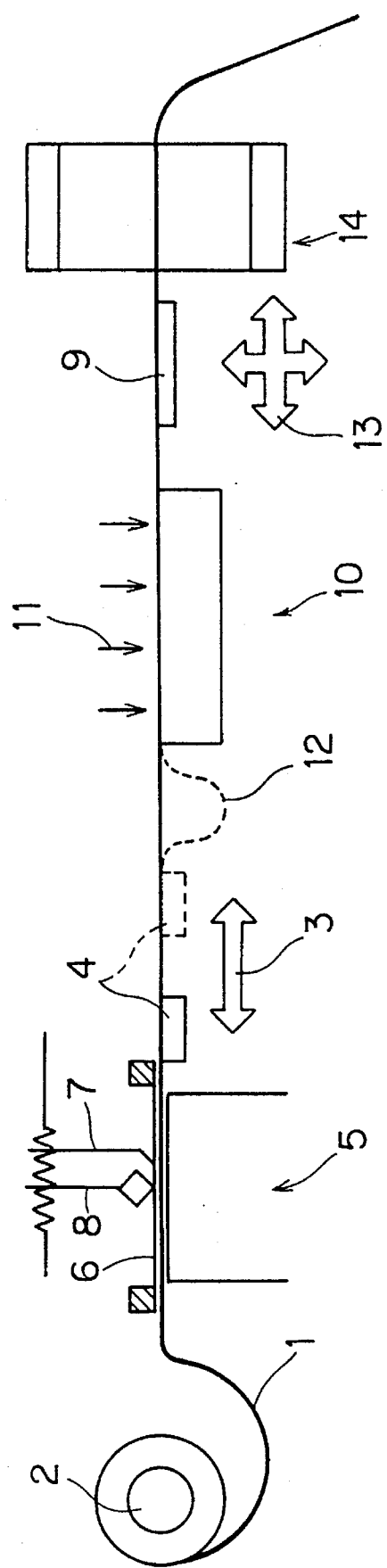
FIG. 1 is a side elevational view illustrating an apparatus for carrying out a method of manufacturing a multilayer ceramic electronic component according to an embodiment of the present invention.

FIG. 1 illustrates an apparatus for carrying out a method of manufacturing a multilayer ceramic electronic component according to an embodiment of the present invention.

This apparatus comprises a supply reel 2 for supplying a long ceramic green sheet 1.

The long ceramic green sheet 1 is drawn out from the supply reel 2, and guided to a printing station 5 by a reciprocating table 4 which reciprocates along the arrow 3. At the printing station 5, conductor films such as internal electrodes are printed on the surface of the ceramic green sheet 1 with conductive paste. When it is desired to obtain ceramic green sheets provided with no internal electrodes, which are to be stacked on upper and lower portions of a finally obtained multilayer ceramic capacitor in appropriate numbers respectively, no such printing step is carried out. A computer (not shown) performs such control. This computer is previously supplied with data representative of stacking modes for the multilayer ceramic capacitor to be obtained. At the printing station 5, the conductor films are printed by screen printing, for example. For that purpose, a screen 6, a scraper 7 for spreading the conductive paste on the screen 6, and a squeegee 8 for applying the conductive paste onto the ceramic green sheet 1 through the screen 6 are arranged above the ceramic green sheet 1. Registration marks may be printed at the printing station 5 simultaneously with the conductor films.

Then, the long ceramic green sheet 1 provided with the conductor films is carried by an XY table 9, and guided to a drying station 10. Hot air 11 is supplied to the drying station 10 from above, for example. This drying station 10 is adapted to dry the conductor films printed at the printing station 5.

In order to absorb any difference between the feed rates of the reciprocating table 4 and the XY table 9, the ceramic green sheet 1 is allowed to sag at a portion 12 between the reciprocating table 4 and the drying station 10.

The XY table 9 can move the ceramic green sheet 1 in directions X and Y in a horizontal plane, as shown by the arrow 13.

The ceramic green sheet 1 is then guided to a punching station 14. FIG. 1 shows the punching station 14 in a simplified manner, while FIG. 2 illustrates a punching device 15 and a stacking device 16 which are included in the punching station 14 in detail.

Referring to FIG. 2, arms 18 holding both side edges of the ceramic green sheet 1 are driven by the aforementioned XY table 9, to feed the ceramic green sheet 1 to a position under a die 17.

The die 17 is provided therein with optical fiber members 19 for position recognition. An optical recognizer (not shown) such as a CCD camera, for example, recognizes the registration marks, which have previously been printed on the ceramic green sheet 1, through the optical fiber members 19. The arms 18 are driven in response to the recognition information, to register the ceramic green sheet 1. Alternatively, images may be incorporated from the exterior of the die 17 by a CCD camera or the like to correct positions, in order to register the ceramic green sheet 1.

A punch 20 is driven along the arrow 21, to punch out the ceramic green sheet 1 in association with the die 17. The punched ceramic green sheet 1 is held by the punch 20 to pass through the die 17, and is directly carried to a transfer head 22. FIG. 3 shows this state.

The transfer head 22 is set so that its initial position is aligned with an end position of the punching operation carried out by the punch 20. The transfer head 22 comprises suction holes 23 for holding the ceramic green sheet 1 by vacuum suction. Therefore, the ceramic green sheet 1, which is carried to the transfer head 22 by the punch 20 in the aforementioned manner, is held by the transfer head 22 through suction.

The transfer head 22 contains heating irons 24 for electric heating, for example. The heating irons 24 are moveable between exposed and non-exposed positions with respect to the lower surface of the transfer head 22. Referring to FIGS. 2 and 3, the heating irons 24 are not exposed. Referring to FIG. 4, on the other hand, the heating irons 24 are exposed, as hereinafter described. Preferably the heating irons 24 are located to face edge portions of the punched ceramic green sheet 1.

After the ceramic green sheet 1 has been placed on the transfer head 22 and held there by suction as shown in FIG. 3, the punch 20 is downwardly moved to the position shown in FIG. 2. Then, the transfer head 22 is laterally moved along the arrow 25 shown in FIG. 2. A stacking base 26, which is included in the stacking device 16, is arranged at the end position of such lateral movement of the transfer head 22. A plurality of punched ceramic green sheets 1, which are carried by the transfer head 22, are stacked on the stacking base 26. The stacking base 26 preferably comprises suction holes 27 for applying suction to the lowermost ceramic green sheet 1.

When the transfer head 22 is moved along the arrow 25 as hereinabove described to reach the end position of its operation, the stacking base 26 is upwardly moved as shown by the arrow 28 in FIGS. 2 and 4. Thus, the ceramic green sheets 1 carried by the transfer head 22 are stacked with each other on the stacking base 26, as shown in FIG. 4.

When the ceramic green sheets 1 are completely stacked with each other, the heating irons 24 contained in the transfer head 22 are downwardly moved along the arrows 29, to bring end portions of the uppermost ceramic green sheet 1 into pressure contact with the ceramic green sheet 1 which is located immediately under the same. The edge portions of green sheets 1 are generally not provided with conductive films. Therefore, when the edge portions of green sheets 1 are heated and brought into pressure contact with each other by heating irons 24 to form a multilayer ceramic electronic component, strain caused by the heating does not strain the conductive film.

Then, air is blown out from the suction holes 23 of the transfer head 22 and the stacking base 26 is downwardly moved, which completes a single step of the manufacturing melted.

Thereafter similar steps are repeated a desired number of times, to obtain a layered product for a multilayer ceramic electronic component such as a multilayer ceramic capacitor. This layered product is further pressurized as needed. In order to obtain a multilayer ceramic capacitor, the layered product is properly cut into a plurality of chips in general, and each chip is fired and provided with external electrodes.

various modes of the operation for punching out the ceramic green sheet 1 at the punching station 14 will now be described.

Figure 5:
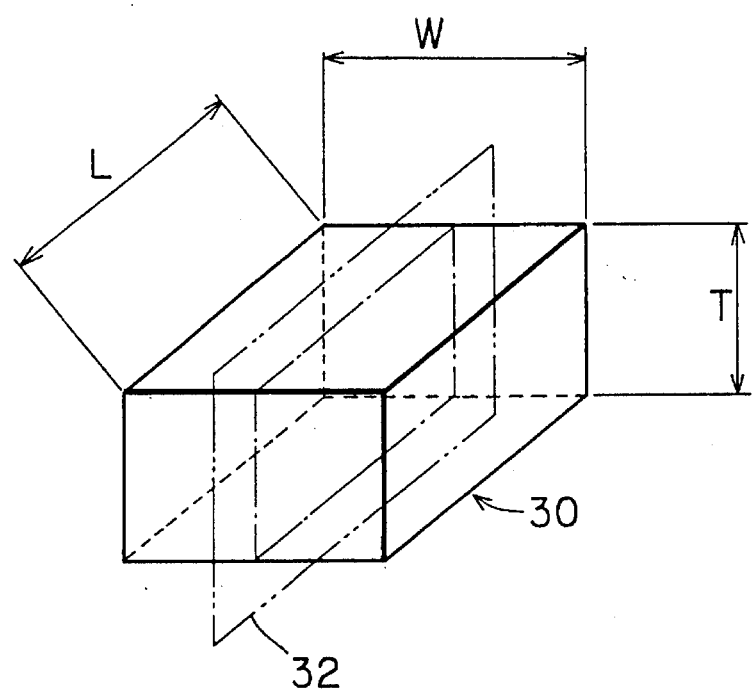
FIG. 5 is a perspective view showing the appearance of a multilayer chip 30 for obtaining a multilayer ceramic capacitor.

FIG. 5 is a perspective view showing the appearance of a multilayer chip 30. This multilayer chip 30 is obtained by cutting the layered product of the ceramic green sheets 1, which is formed by the punching device 15 and the stacking device 26 shown in FIGS. 2 to 4. The multilayer chip 30 forms a single unit of the multilayer ceramic capacitor. This multilayer chip 30 has a longitudinal dimension L, a cross-directional dimension W, and a thickness-directional dimension T.

Figure 6:
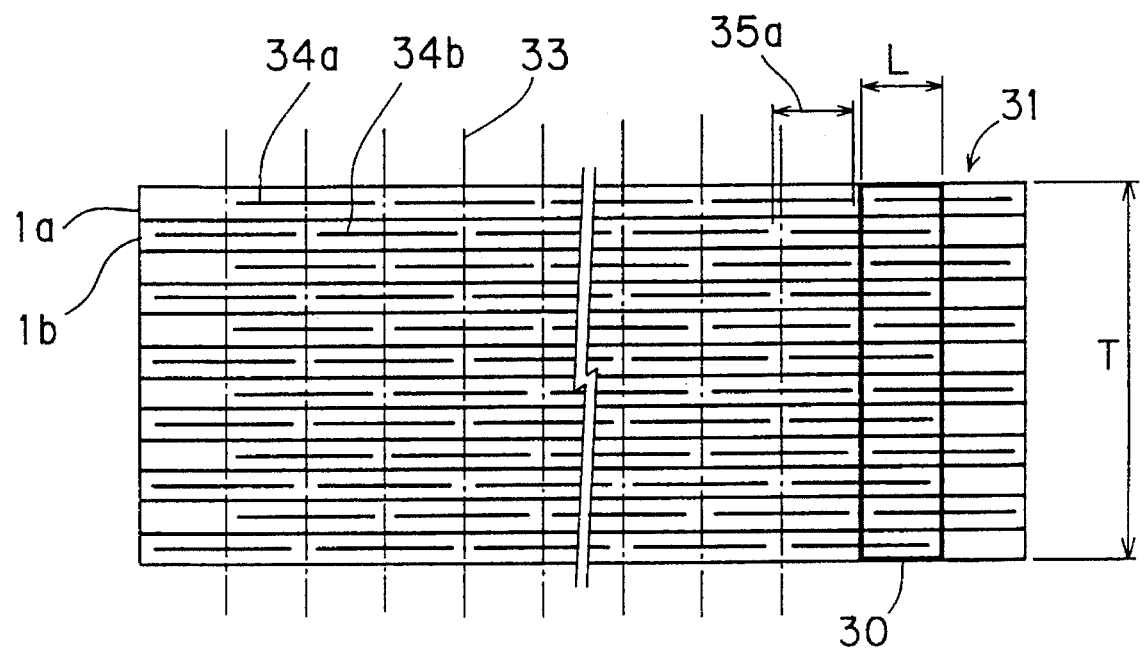
FIG. 6 is a sectional view illustrating a layered product 31 which is prepared for obtaining the multilayer chip 30 shown in FIG. 5.

FIG. 6 is a sectional view illustrating a layered product 31, through a section corresponding to that taken along a cutting plane 32 shown by phantom lines in FIG. 5. FIG. 6 shows cutting-plane lines 33, along which the layered product 31 is cut to obtain the individual multilayer chip 30 shown in FIG. 5. FIG. 6 shows a single multilayer chip 30 with thick contour lines. As understood from the longitudinal dimension L and the thickness-directional dimension T shown in FIG. 6, the thickness-directional dimension T is considerably exaggerated in FIG. 6. Referring to FIG. 6, further, internal electrodes 34a and 34b are illustrated in thickness-directional centers of ceramic green sheets 1a and 1b respectively, simply for convenience of illustration.

Referring to FIG. 6, the internal electrodes 34a and 34b, which are provided on the ceramic green sheets 1a and 1b forming the layered product 31 respectively, are identical in geometry to each other but displaced by an amount 35a from each other. The internal electrodes 34a and 34b thus displaced from each other can define opposite internal electrodes for a multilayer ceramic capacitor in each multilayer chip 30. The ceramic green sheets 1a and 1b having such internal electrodes 34a and 34b can be obtained by punching out the long ceramic green sheet 1, which is provided with internal electrodes by punching the same print pattern, at the punching station 14, while displacing the same by the amount 35a. Such an amount 35a of displacement is previously inputted in the computer (not shown). In the step shown in FIG. 2, the optical recognizer recognizes the registration marks through the optical fiber members 19 so that the ceramic green sheet 1 is registered on the basis thereof, and is then subjected to the punching step.

The aforementioned displacement of the punching positions is also useful for changing the capacitance obtained for the multilayer ceramic capacitor. This is now described with reference to FIGS. 7 and 8.

Figure 7:
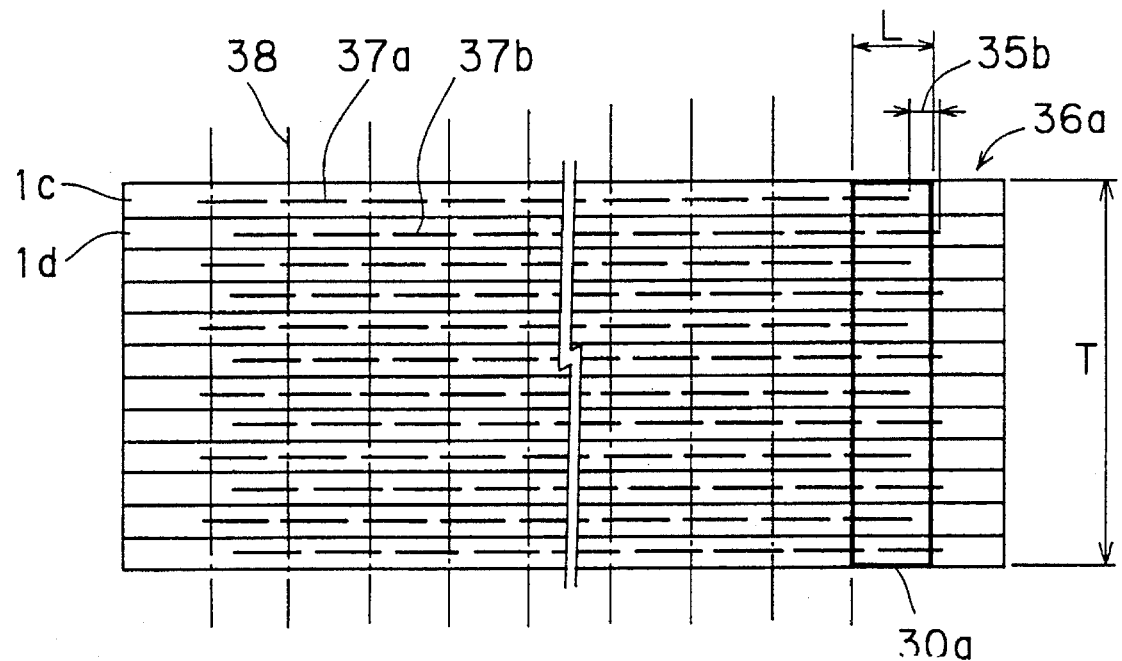
FIGS. 7 and 8 are sectional views corresponding to FIG. 6, respectively showing layered products from which multilayer chips can be extracted for obtaining multilayer ceramic capacitors whose acquired capacitance values are different from each other, by providing different amounts of displacement of internal electrodes.
Figure 8:
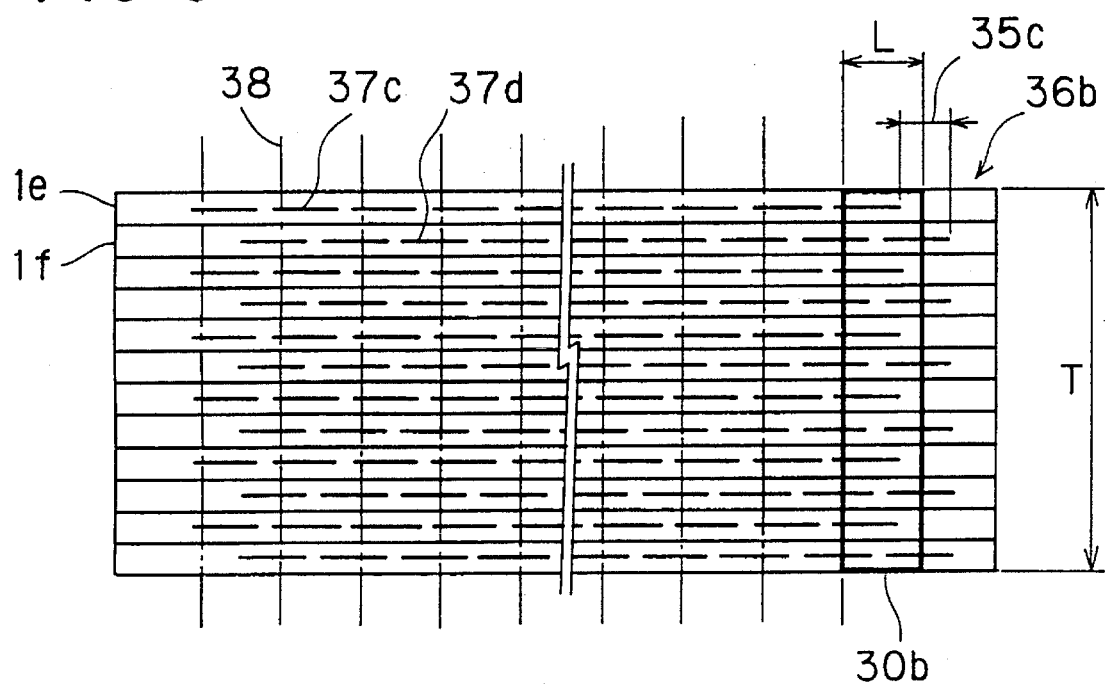

FIGS. 7 and 8 are sectional views corresponding to FIG. 6.

Referring to FIG. 7, a layered product 36a is formed by ceramic green sheets 1c and 1d having internal electrodes 37a and 37b respectively. When the layered product 36a is cut along cutting-plane lines 38, an individual multilayer chip 30a is obtained as shown by thick contour lines. In such a multilayer chip 30a, the internal electrodes 37a and 37b are opposed to define opposite internal electrodes for a multilayer ceramic capacitor.

The ceramic green sheets 1c and 1d forming such a layered product 36a are provided with the internal electrodes 37a and 37b having the same geometry. In the punching step, the ceramic green sheets 1c and 1d are displaced from each other by an amount 35b.

In order to change the capacitance provided by such a multilayer ceramic capacitor, the punching step for the ceramic green sheets 1c and 1d may be carried out so as to change the amount 35b of displacement. FIG. 8 shows a layered product 36b for obtaining a multilayer ceramic capacitor which provides relatively small capacitance, and a multilayer chip 30b cut out from the layered product 36b.

As shown in FIG. 8, the layered product 36b is formed by ceramic green sheets 1e and 1f. The ceramic green sheets 1e are provided with internal electrodes 37c, while the ceramic green sheets if are provided with internal electrodes 37d. The internal electrodes 37c and 37d are identical in geometry to each other, as well as to the internal electrodes 37a and 37b shown in FIG. 7. Namely, all internal electrodes 37a, 37b, 37c and 37d are formed through the same printing step.

However, the ceramic green sheets 1e and if forming the layered product 36b shown in FIG. 8 are punched out so that the internal electrodes 37c and 37d are displaced from each other by an amount 35c, which is larger than the amount 35b shown in FIG. 7. In the multilayer chip 30b obtained by cutting the layered product 36b along the cutting-plane lines 38, the internal electrodes 37c and 37d are opposed to each other with opposite areas which are smaller than those in FIG. 7. Thus, it is possible to obtain a multilayer ceramic capacitor having smaller capacitance.

Thus, according to this embodiment, it is possible to change the opposite areas of the internal electrodes by changing the amount of displacement between the internal electrodes even if the internal electrodes are printed in the same geometrical mode. Therefore, it is possible to change the capacitance of the multilayer ceramic capacitor.

Since the various steps are continuously carried out on the long ceramic green sheet 1 as shown in FIG. 1, a step of temporarily stacking the ceramic green sheet is not required, and it is easy to maintain cleanliness of the ceramic green sheet to be handled.

Further, the punching step is carried out on the basis of the registration marks which are printed simultaneously with the conductor films, i.e., the internal electrodes, whereby no strict registration is required in printing.

Although an embodiment of the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing a plurality of ceramic green sheets having predetermined patterns of conductor films provided thereon for use in manufacturing a multilayer ceramic electronic component, the method comprising the steps of:

preparing a long ceramic green sheet;

printing a plurality of conductor films on the surface of said long ceramic green sheet;

drying said conductor films printed on said long ceramic green sheet;

feeding said long ceramic green sheet along a longitudinal direction thereof to a plurality of predetermined punching positions of said long ceramic green sheet;

punching out said long ceramic green sheet into respective ceramic green sheets of prescribed sizes at said predetermined punching positions so as to obtain at least one punched ceramic green sheet having a first pattern of said conductor films, and at least one punched ceramic green sheet having a second pattern of said conductor films; and stacking said punched ceramic green sheets with each other in a predetermined order so as to obtain stacked ceramic green sheets, wherein said printing, drying, feeding and punching out steps are continuously carried out while feeding said long ceramic green sheet along said longitudinal direction thereof.

2. A method in accordance with claim 1, further comprising a step of heating edge portions of said stacked ceramic green sheets.

3. A method in accordance with claim 1, wherein the plurality of conductor films are printed in the same pattern.

4. A method in accordance with claim 1, wherein said stacking step includes stacking said punched ceramic green sheets with each other based upon corresponding outlines of said punched ceramic green sheets.

5. A method in accordance with claim 1, further comprising the steps of providing registration marks on the surface of said long ceramic green sheet, and predetermining a first and second registering condition of said registration marks to correspond to said first pattern of said conductor films and said second pattern of said conductor films, respectively, said feeding step includes advancing said long ceramic green sheet to a first punching position corresponding to said first registering condition of said registration marks, and advancing said long ceramic green sheet to a second punching position corresponding to said second registering condition of said registration marks.

6. A method in accordance with claim 5, wherein said stacking step comprises stacking first ones of said ceramic green sheets, which are punched out under said first registering condition, alternately with second ones of said ceramic green sheets, which are punched out under said second registering condition.

7. A method in accordance with claim 5, further comprising the step of changing the first registering condition and the second registering condition.

8. A method in accordance with claim 7, wherein said changing step causes a change in the corresponding punching positions of said long ceramic green sheet such that respective opposed surface areas of said conductor films in said stacked ceramic green sheets are changed.

9. A method of preparing a plurality of ceramic green sheets having predetermined patterns of internal electrodes provided thereon for use in manufacturing a multilayer ceramic capacitor having a desired capacitance, the method comprising the steps of:

preparing a long ceramic green sheet;

printing a plurality of internal electrodes on the surface of said long ceramic green sheet;

drying said internal electrodes printed on said long ceramic green sheet;

feeding said long ceramic green sheet along a longitudinal direction thereof to a plurality of predetermined punching positions of said long ceramic green sheet;

punching out said long ceramic green sheet into respective ceramic green sheets of prescribed sizes at said predetermined punching positions so as to obtain at least one punched ceramic green sheet having a first pattern of said internal electrodes, and at least one punched ceramic green sheet having a second pattern of said internal electrodes; and stacking said punched ceramic green sheets in a predetermined order so as to obtain stacked ceramic green sheets, wherein said printing, drying, feeding and punching out steps are continuously carried out while feeding said long ceramic green sheet along said longitudinal direction thereof.

10. A method in accordance with claim 9, wherein the plurality of internal electrodes are printed in the same pattern.

11. A method in accordance with claim 9, wherein said stacking step includes stacking said punched ceramic green sheets with each other based upon corresponding outlines of said punched ceramic green sheets.

12. A method in accordance with claim 9, further comprising the steps of providing registration marks on the surface of said long ceramic green sheet, and predetermining a first and second registering condition of said registration marks to correspond to said first pattern of said internal electrodes and said second pattern of said internal electrodes, respectively, said feeding step includes advancing said long ceramic green sheet to a first punching position corresponding to said first registering condition of said registration marks, and advancing said long ceramic green sheet to a second punching position corresponding to said second registering condition of said registration marks.

13. A method in accordance with claim 12, wherein said stacking step comprises stacking first ones of said ceramic green sheet, which are punched out under said first registering condition, alternately with second ones of said ceramic green sheets, which are punched out under said second registering condition.

14. A method in accordance with claim 12, further comprising the step of changing the first registering condition and the second registering condition.

15. A method in accordance with claim 14, wherein said changing step causes a change in respective opposed surface areas of a first and second internal electrode and thereby changes the capacitance obtained for the capacitor.

* * * * *